US007899963B2

(12) United States Patent
Mitter

(10) Patent No.: US 7,899,963 B2
(45) Date of Patent: Mar. 1, 2011

(54) METHOD AND APPARATUS FOR ALLOCATING INPUTS IN MICROCONTROLLERS, AND CORRESPONDING MICROCONTROLLER

(75) Inventor: Carsten Mitter, Wahlsburg (DE)

(73) Assignee: Robert Bosch GmbH, Stuttgart (DE)

( * ) Notice: Subject to any disclaimer, the term of this patent is extended or adjusted under 35 U.S.C. 154(b) by 399 days.

(21) Appl. No.: 11/658,332

(22) PCT Filed: Jul. 21, 2005

(86) PCT No.: PCT/EP2005/053560

§ 371 (c)(1),
(2), (4) Date: Aug. 21, 2009

(87) PCT Pub. No.: WO2006/010739

PCT Pub. Date: Feb. 2, 2006

(65) Prior Publication Data

US 2009/0307550 A1    Dec. 10, 2009

(30) Foreign Application Priority Data

Jul. 26, 2004  (DE) .................. 10 2004 036 173

(51) Int. Cl.
*G06F 13/00*  (2006.01)
*G06F 9/00*   (2006.01)
*G06F 9/24*   (2006.01)
*G06F 11/00*  (2006.01)

(52) U.S. Cl. .............. 710/104; 710/8; 710/10; 713/1; 713/2; 713/100; 712/247; 714/2; 714/3; 326/16; 326/38; 702/77

(58) Field of Classification Search ............ 710/8, 710/10, 104; 712/247; 713/1, 2, 100
See application file for complete search history.

(56) References Cited

U.S. PATENT DOCUMENTS

| 5,097,206 | A  |    | 3/1992  | Perner et al. |
|-----------|----|----|---------|---------------|
| 5,670,890 | A  |    | 9/1997  | Colwell et al. |
| 5,701,115 | A  |    | 12/1997 | Right et al. |
| 6,237,054 | B1 | *  | 5/2001  | Freitag, Jr. ............... 710/72 |
| 6,327,632 | B1 | *  | 12/2001 | Sollars .................... 710/10 |
| 6,460,171 | B1 | *  | 10/2002 | Couvert et al. ............ 716/16 |
| 6,789,030 | B1 | *  | 9/2004  | Coyle et al. ............... 702/77 |
| 7,111,190 | B2 | *  | 9/2006  | Venkatraman et al. ....... 714/6 |
| 7,132,849 | B2 | *  | 11/2006 | Tucker et al. ............. 326/38 |
| 7,230,446 | B2 | *  | 6/2007  | Ohara .................... 326/16 |

FOREIGN PATENT DOCUMENTS

JP        1 288330      10/1999

* cited by examiner

*Primary Examiner*—Brian T Misiura
(74) *Attorney, Agent, or Firm*—Kenyon & Kenyon LLP

(57) ABSTRACT

A method and an apparatus for allocating configuration inputs of a microcontroller, the apparatus being embodied in such a way that at each configuration input, one signal state of at least two possible signal states is to be set, wherein there is connected to each configuration input one respective energy source that can assume at least two states, in order to set the at least two signal states at each configuration input, a setting arrangement being provided with which the states of each energy source are controlled in such a way that the predefined signal state exists for each configuration input.

20 Claims, 2 Drawing Sheets

METHOD AND APPARATUS FOR ALLOCATING INPUTS IN MICROCONTROLLERS, AND CORRESPONDING MICROCONTROLLER

FIELD OF THE INVENTION

The present invention relates to a method and an apparatus for allocating configuration inputs of a microcontroller, such that at each configuration input one signal state of at least two possible signal states is to be set, according to the preambles of the independent claims. The present invention also relates to a microcontroller that contains such an apparatus.

BACKGROUND INFORMATION

Microcontrollers are a central constituent of modern electronic control units. For correct functioning, an electrically conductive connection is generally necessary between the functional units of the microcontroller and the surrounding circuit. This also applies to so-called system and configuration inputs, with which certain configurable properties are defined. These inputs are hereinafter referred to as "configuration inputs," and are generally not connected to the actual surrounding circuit but rather are fixedly connected to a supply voltage Vcc or to the ground potential Vss of the circuit. In other words, at each of these configuration inputs, one signal state of at least two possible signal states is to be set.

As a result of various causes, however, such a connection for achieving the corresponding signal state at the configuration input may not come about as desired, or may later be severed or interrupted. Possible causes of this are solder joints or connecting points, or bonding wires, at which, for example during the manufacturing process itself or also as a result of external action, no connection or only an inadequate connection was produced, so that either no connection exists from the outset, or only an inadequate connection exists that later breaks completely. Problems can also occur if inadequate connections make contact only intermittently, or if problematic characteristics such as emissions, changes in resistance, or the like occur as a result. Problems that are known from practical use are, for example, so-called "cold joints" or severed bonding wires. In many cases the circuit then no longer functions properly.

It is an object of the present invention to resolve the aforesaid problems and ensure proper functioning.

SUMMARY

According to example embodiments of the present invention, a method and a corresponding apparatus are provided for allocating configuration inputs of a microcontroller, such that at each configuration input one signal state of at least two possible signal states is to be set, and advantageously an energy source is provided for each configuration input, and all the energy sources are set, by way of a configuration word, in such a way that one predefined signal state of the at least two signal states is present at each configuration input.

The corresponding apparatus for allocating configuration inputs of the microcontroller may be embodied in such a way that at each configuration input one signal state of at least two possible signal states is to be set, one energy source being associated with each configuration input and being connected to it, which source can assume at least two states, in order to set the at least two signal states at each configuration input, a setting arrangement being provided with which the states of each energy source are controlled in such a way that the predefined signal state exists for each configuration input.

In other words, by way of individually configurable energy sources a specific pattern of signal states, in particular a logical pattern in the context of signal states 0 and 1 that is necessary for correct functioning of the circuit or for the respective application, can be set at the configuration inputs very largely autarchically or indeed entirely independently, thus ensuring functioning.

The energy source may usefully contain a separate current source for each signal state to be set. It is then advantageously possible to set the respective signal state by simply switching over between the individual current sources.

The current sources of the energy source may be respectively a pull-up current source and a pull-down current source, a switch simultaneously being provided that switches over between the two current sources.

The setting arrangement is advantageously provided as a configuration register that, in particular, receives the configuration word that contains a register cell for each configuration input.

A result is that, usefully, each register cell is unequivocally associated with one energy source and with one configuration input.

For security reasons, it may be useful if at least one additional register cell is provided with which the other register cells, i.e., the configuration word, can be blocked and/or enabled, the additional register cell (this enabling register cell) either being contained in the configuration register or associated with it and located externally.

For signal adaptation, a signal conditioning arrangement may be inserted between the setting arrangement and the configuration inputs; in particular, a signal conditioning module may be inserted between each configuration input and each register cell in order to perform the signal adaptation.

The configuration inputs are therefore connected to the energy sources, and individual connections for setting the signal states are provided between them and the setting arrangement, i.e., in particular the configuration register, in accordance with the number of configuration inputs. Alternatively, a connection can be provided between the energy sources and configuration inputs, which are connected to one another, and the setting arrangement, which connection contains a number of connecting lines that is less than the number of configuration inputs to be configured, a coding and decoding device then being provided in order to address the correct energy sources or configuration inputs by way of a binary coding. This can be taken to the point that only a single-wire connection is used.

In a preferred embodiment, exactly two signal states are set, in particular a logical 1 when supply voltage is present and a logical 0 when ground is present.

The example method for allocating configuration inputs can then be used in the context of a test mode to set at each of the configuration inputs, using the configuration word, a signal state that is different in each case from the one that was originally set and provided. In other words, in the context of a test mode, a signal state is advantageously set at each of the configuration inputs, a signal state different therefrom being defined by the configuration word, and the different signal state prevailing over the set signal state only if a fault exists in terms of the set signal state of the respective configuration input, which can then be detected in the context of the test mode.

BRIEF DESCRIPTION OF THE DRAWINGS

The present invention is explained below in further detail with reference to the figures.

The present invention is explained in more detail below with reference to the exemplary embodiments.

DETAILED DESCRIPTION OF EXAMPLE EMBODIMENTS

Figure 1:
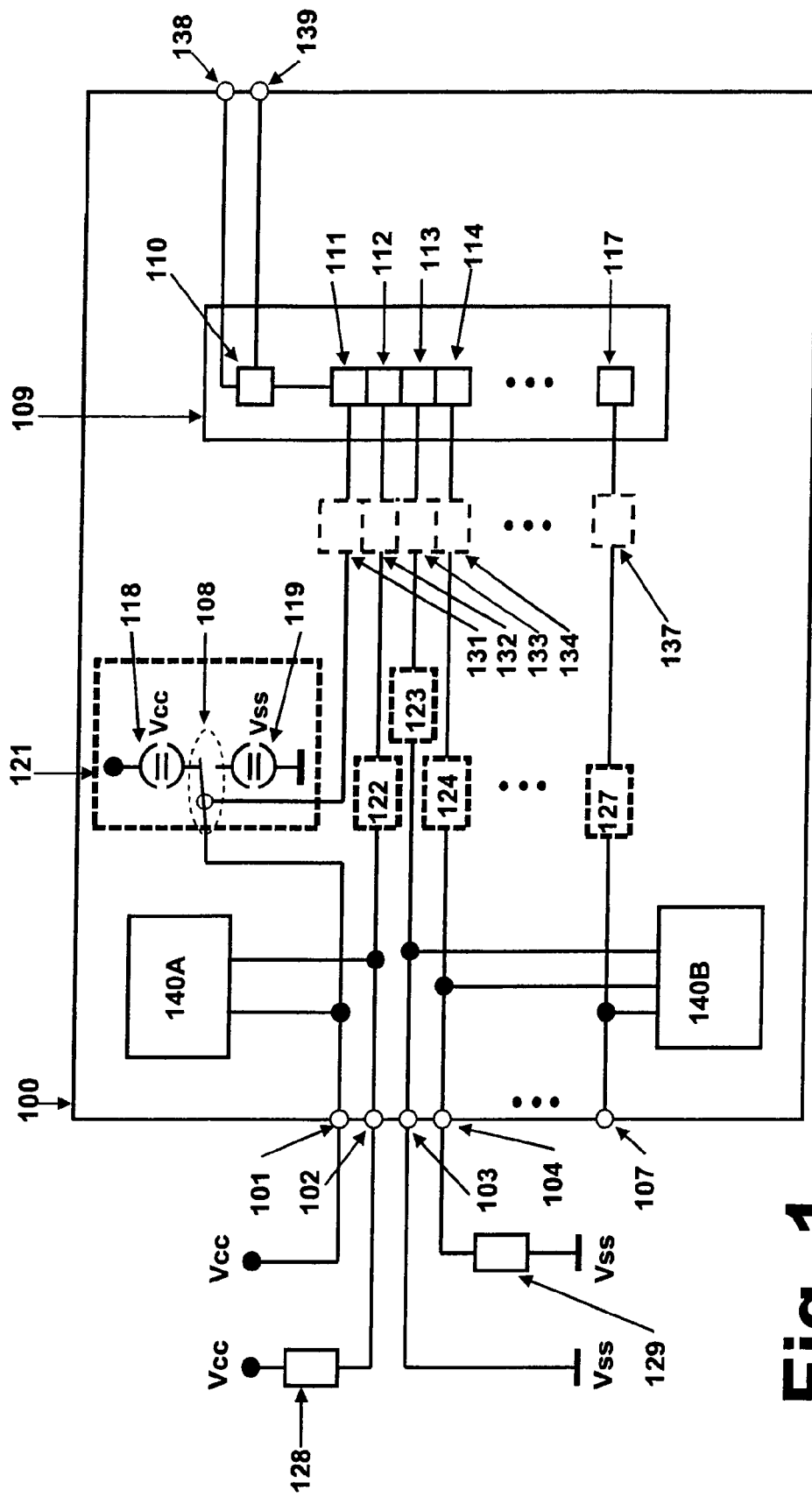
FIG. 1 shows a microcontroller having an apparatus according to an example embodiment of the present invention for securing the signal states.

FIG. 1 shows a microcontroller 100 having system and configuration inputs—which, as described above, are referred to simply as configuration inputs—numbered 101 to 107. The three dots indicate that any number of such configuration inputs can be present. Internal microcontroller functional units are schematically depicted as blocks, and graphically grouped together, as reference numbers 140A and 140B. 121 to 127 each show an energy source, corresponding to the number of configuration inputs to be allocated; here again, the three dots indicate the arbitrary number thereof, corresponding to the number of configuration inputs to be allocated. The setting arrangement, in this case specifically a configuration register, is labeled 109. Contained therein are memory or register cells 111 to 117, the number of which corresponds, in particular, to the number of configuration inputs. These memory cells or register cells 111 to 117 serve to control the energy sources, in particular the internal current sources, as will be described in further detail.

Register cell 110 serves to block or enable register cells 111 to 117 in which the configuration word is storable. This can be accomplished via an optional external input 139 by way of which blocking and/or enabling is possible. This enabling register cell 110 can, however, also be written internally in the microcontroller itself upon storage of the configuration word, which would thus make external input 139 obsolete. An output that likewise is optional, and permits the status of the additional register cell 110 (constitute an enabling register cell) to be read out, is designated 138. Optionally provided as 131 to 137 is a signal conditioning system to make possible, for example, a level adaptation (e.g., using Schmitt triggers) if necessary.

In this example, configuration inputs 101 to 107 are fixedly connected to a supply voltage Vcc or to a ground potential Vss, resistors 128 and 129 being depicted by way of example as a pull-up or pull-down resistor. In addition to these two potentials Vcc and Vss, it is also possible to provide more than two potentials and therefore more than two signal states at configuration inputs 101 to 107. In the example hereinafter, however, it is assumed there are two potentials, i.e., supply voltage Vcc and ground Vss, supply voltage Vcc representing, by way of example, a logical 1, and ground Vss a logical 0.

For correct functioning of the circuit, these configuration inputs of the microcontroller are therefore allocated in accordance with a predefined functionally relevant pattern. To ensure this according to the present invention, additional energy sources 121 to 127 are provided for each configuration input, represented in this example internally by a pull-up current source 118 and a pull-down current source 119 as well as a switching means 108 for switching over between the two current sources. According to the present invention, the microcontroller therefore possesses internal pull-up or pull-down current sources or energy sources which are individually configurable, and by way of which a specific logical pattern that is necessary for the respective application can be implemented autarchically, or if an external allocation is present, in the event of a malfunction at a configuration input that fault can be resolved.

The present invention thus permits reliable operation of the circuit, i.e., in particular of the microcontroller, even in the event of an erroneous connection to a potential external allocator by way of which the user can configure the microcontroller in accordance with application-specific requirements. An important constituent of the present invention is an individually definable setting arrangement 109, for example a configuration register or a configuration word stored therein, with which energy sources 121 to 127, in particular pull-up and pull-down current sources 118 and 119 or even specific resistors in the context of an energy source, are controlled. Energy sources that exhibit the properties according to the present invention are possible in many respects, but reference will be hereinafter only generally to an energy source or to pull-up or pull-down current sources, although such energy sources, in particular as current sources or voltage sources, can of course be implemented by way of a specific resistor configuration, batteries, rechargeable batteries, or the like. Each configuration input 101 to 107 is equipped with a respective energy source 121 to 127, here specifically with a respective pull-up current source 118 and a pull-down current source 119.

In a first embodiment, the internal current sources or the energy source are embodied to be only strong enough that the signal states predefined by the energy source or the pull-up and pull-down current sources can be overwritten by a potentially present external allocator. By way of the setting arrangement, specifically configuration register 109, it is possible to define individually for each input signal, i.e., for each configuration input, the signal status (here the logical status 0 or 1) that occurs when the connection to the external allocator, with which the user sets the intended behavior of the microcontroller has not been interrupted by a fault. In this case the microcontroller still functions as desired despite an interruption in the electrical connection to the external allocator, since the respective required logic pattern, i.e., the sum of the respective signal states, has additionally been set by way of a configuration word in the configuration register.

In a second embodiment, the internal energy sources 121 to 127 or the exemplifying internal pull-up and pull-down current sources 118 and 119 are embodied to be sufficiently strong that an unequivocal state occurs under all conditions (e.g., with EMC irradiation or ground fault). The external connection can thus be entirely dispensed with in this second embodiment, and an autarchic internal supply system is possible. In this case, however, the requisite configuration word should then be set in the configuration register, i.e., in the setting arrangement, already upon manufacture of the microcontroller, or programming of the configuration word in the configuration register should already be ensured, in particular by the user, prior to use of the microcontroller.

In all the embodiments, the setting arrangement can also be embodied as a large-dimension memory or in any other conceivable form, the simplest form—as a configuration register having individual memory cells or register cells and individual bits—being used here for writing.

Each memory cell or register cell in the configuration register, i.e., in the configuration word, is connected to an energy source, i.e., in this case specifically to a unit made up of a pull-up and pull-down current source, at a configuration input of microcontroller 100. The total number of memory regions or register cells present is therefore the same as the number of configuration inputs, i.e., input pins having a corresponding function. Depending on the logical state of the register cell, i.e., in particular in the case of binary coding, a 0 or 1 in the configuration word, either pull-up current source 118 or pull-down current source 119 is switched on. For a 0 in the register, for example, pull-down current source 119 of the relevant input is switched on, which then also corresponds to a logical 0 at configuration input 101. With a logical 1 in register 111, pull-up current source 118 would then be switched on; this would correspond, for example, to a logical 1 at configuration input 101. The configuration register or configuration word can be implemented, for example, as a programmable word in a nonvolatile reprogrammable memory such as, for example, a flash memory, EPROM, or EEPROM memory, but also in nonvolatile one-time-programmable memories such as a PROM or, in particular directly at the time of manufacture of the microcontroller, in a ROM.

Figure 2:
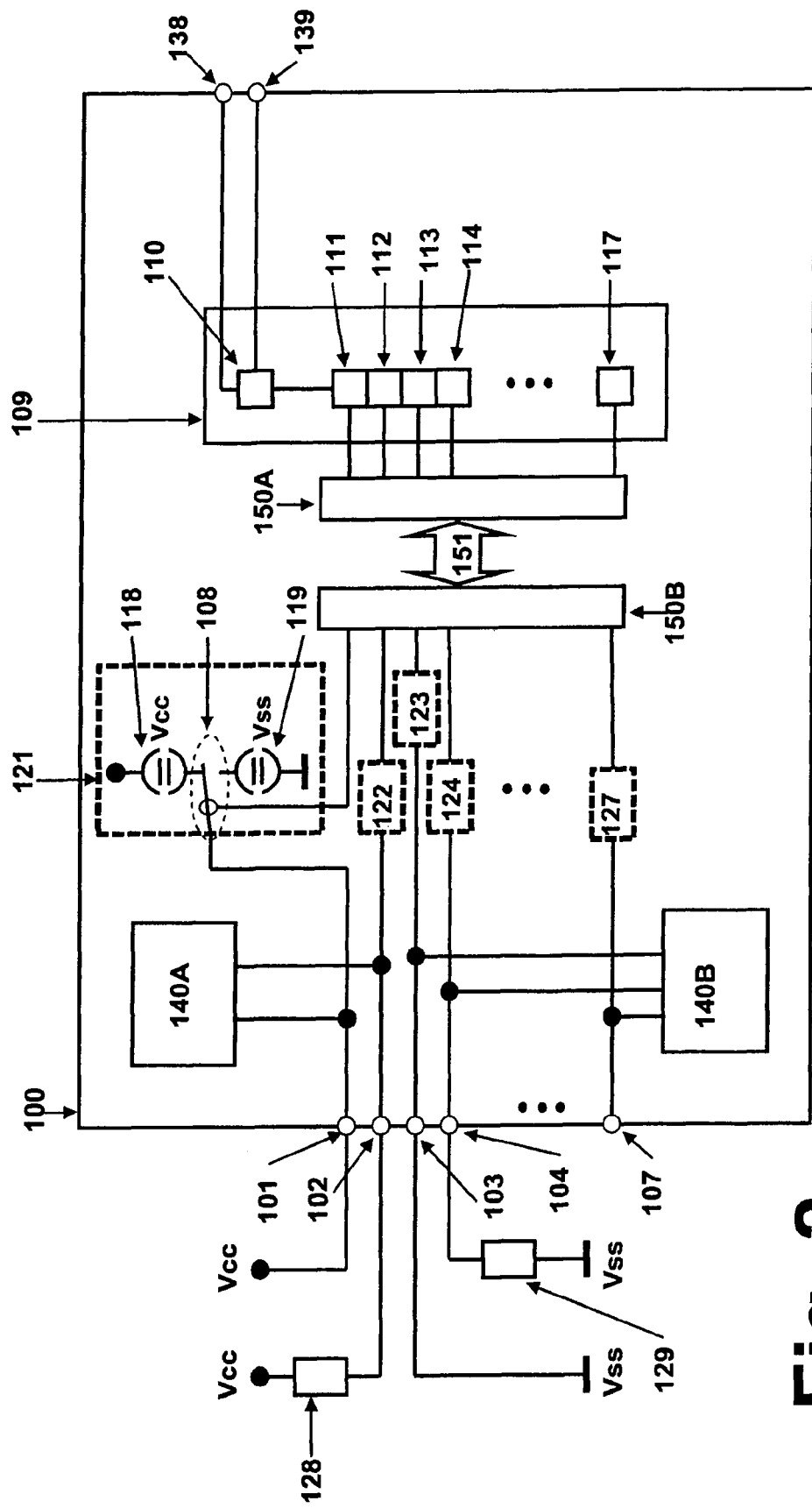
FIG. 2 likewise shows an apparatus according to an example embodiment of the present invention in which, however, a smaller number of connections is provided between a setting arrangement and configuration inputs.

In the case of write-many memories, a protective mechanism can be provided which prevents inadvertent overwriting of the configuration word, i.e., a write protector. This protector could be implemented, for example, by way of an additional locking bit or enabling bit 110 with which, depending on its state, the configuration word is writable or blocked. By way of this locking or activation bit, i.e., enabling bit 110, the configuration word is made active. As soon as the configuration word has been activated, the energy sources, in particular current sources, configured e.g. in accordance with the status of the configuration word, are electrically connected to the configuration inputs. This applies to every operating state of the microcontroller. In the inactive state, the configuration of the microcontroller is controlled exclusively via the external allocator, if one is present. Otherwise provision must be made for the configuration to be present by way of a corresponding configuration word. In the specific embodiment of two current sources with selection switches, i.e. switching means 108, therebetween, it is advantageous if selection switch 108 is located between the current sources, specifically in a central position, with the result that the circuit branch to the configuration inputs is high-resistance. Alternatively, the enabling bit, i.e., the additional register cell, could also be controlled by an external microcontroller input 139; this is depicted optionally in FIGS. 1 and 2. The respective status of this additional register cell 110 having the enabling bit for activation or inactivation of the internal configuration location can thus, like the respective active/not active status, be indicated by way of a status output 138, e.g. binary high/low. This status output 138 is also depicted optionally in FIGS. 1 and 2. It may be advantageous if the status of the entire configuration word, i.e., in this case (with a binary presentation) the binary pattern, can be read out by the microcontroller via software. It may likewise be advantageous if the respective logical status of configuration inputs 101 to 107 can be read out, in particular via software. It is then important that the selected logical pattern of signal states at the configuration inputs has assumed the desired state, in accordance with a logical pattern in the configuration word, when the status is queried by the microcontroller. This applies both to signals that are read in only once, e.g., upon enabling of a reset of the microcontroller, and to signals that are continuously queried by the internal functional units of the microcontroller. For signals that are read in upon enabling of a reset of the microcontroller, it may be useful to provide a direct electrical connection between the configuration word, i.e., the configuration register, and the energy sources, in particular the current sources. In such a case the configuration word then cannot be transferred via software protocol. A software protocol transfer of this kind is possible, for example, in FIG. 2, which depicts a variation of the connection between the setting means and the combination of energy source and configuration input. All other designations remain the same as in FIG. 1, except that signal conditioning means 131 to 137 are omitted for the sake of clarity. This signal conditioning system between the configuration word and current source can be, for example, a circuit for level adaptation having, for example, Schmitt triggers.

If flash memories or similar technologies are used to store the configuration word, corresponding decoding and reading circuits (150A, 150B) should then additionally be provided. Such decoding and reading circuits should likewise be provided when a transfer is to occur over fewer lines than would be required in principle by the number of configuration inputs. For a number of connecting lines on a connection 151 that is less than the number of configuration inputs 101 to 107, a coding module 150A as well as a decoding module 150B may be necessary. It is possible in this context on the one hand to use a smaller number of lines, in a form such that all the energy sources can be addressed in coded fashion. If, for example, four configuration inputs are to be allocated, the transfer can occur via two lines, since the four configuration inputs can be coded in binary fashion as $2^2=4$. Correspondingly, with four lines in connection 151, up to 16 ($2^4$) configuration inputs can be coded, and so forth. Alternatively, a single-wire connection 151 could also be implemented, through which the information of the configuration word is transferred via software protocol; this then also affects the conformation of coding apparatus 150A and decoding apparatus 150B.

As described above, the simplest form of a configuration register is selected as a setting arrangement, having individual register cells in which individual bits yield an overall pattern constituting a configuration word. It is of course likewise possible, however, especially in the case of more than two settable states at the configuration inputs, to provide different identifiers and thus larger memory cells 111 to 117. For example, if a distinction is to be made among three states at the configuration inputs, at least two bits ($2^2=4$) in a memory cell 111 to 117 are already necessary, and so forth. In other words, the memory cells can of course also be selected to be larger depending on the number of states to be coded.

The method and apparatus according to the present invention for allocating the configuration inputs of a microcontroller also allow implementation of a test mode, i.e., a testing method, in particular when the configuration word is implemented in a reprogrammable nonvolatile memory, since contradictory requirements for the test mode can then be combined. On the one hand, a test of the external connections in the context of external allocation is then possible, i.e., the circuit does not operate when an external connection is interrupted; and on the other hand, maximally robust operation of the circuit is obtained, i.e., the circuit functions even when an electrical connection to an external allocator is interrupted. In other words, the intended state at each configuration input of the microcontroller is set at an external allocator of the microcontroller. The configuration word in the setting arrangement is then programmed so that at the respective configuration inputs, the energy sources assume the signal state opposite to the external allocator. If the external connection is then not present, the microcontroller thus assumes the mode that was set via the configuration register. This then does not correspond, however, to the mode that was defined via the external allocator. The difference in behavior can then be detected, and an incorrect external connection can thus be identified and localized.

If, however, the external connection, i.e., the connection to the external allocator, is present in correct fashion, the strong external connection then, in the first embodiment, overwrites the weaker internal energy source, in particular current source, so that the microcontroller assumes the mode expected in accordance with the external allocator. When the test of the external allocator has been successfully executed, the internal configuration word can be inverted. The internal configuration word and the external allocator are thus coincident, thereby increasing availability. If an interruption of a connection to the external allocator, i.e., an interruption of an external connection, then occurs later, the circuit still functions correctly because the predefined mode for the microcontroller was additionally set via the internal configuration word. The present invention thus results in redundancy and in increased reliability.

What is claimed is:

1. An apparatus for allocating configuration inputs of a microcontroller, comprising:
    at least one respective energy source connected to each of the configuration inputs, the at least one respective energy source able to assume at least two states to set at least two signal states at each configuration input; and
    a setting arrangement configured to control the states of each energy source in such a way that a predefined signal state exists for each configuration input;
    wherein the apparatus is configured such that:
        one signal state is set at each of the configuration inputs in the context of a test mode; and
        a signal state differing from the one signal state is predefined, the differing signal state prevailing over the set signal state only when a fault exists in terms of the set signal state of the respective configuration input.

2. The apparatus as recited in claim 1, wherein each energy source contains one current source for each signal state to be set.

3. The apparatus as recited in claim 1, wherein each energy source is formed from a pull-up current source and a pull-down current source, and includes a switch that switches over between the pull-up current source and the pull-down current source.

4. The apparatus as recited in claim 1, wherein the setting arrangement includes a configuration register which contains one register cell for each configuration input.

5. The apparatus as recited in claim 4, wherein each register cell is associated with one energy source and one configuration input.

6. The apparatus as recited in claim 4, wherein at least one additional register cell is provided with which the other register cells can be at least one of blocked and enabled, the additional register cell being one of contained in the configuration register or associated with the configuration register.

7. The apparatus as recited in claim 1, further comprising:
    a signal conditioner between the setting arrangement and the configuration inputs.

8. The apparatus as recited in claim 4, further comprising:
    a signal conditioning module inserted between each configuration input and each register cell.

9. The apparatus as recited in claim 1, further comprising:
    a single-wire connection between the setting arrangement and mutually connected configuration inputs and energy sources, a coding and decoding device being provided for the mutual connection.

10. The apparatus as recited in claim 1, further comprising:
    a connection between the setting arrangement and mutually connected configuration inputs and energy sources, the connection including a number of connecting lines, the number provided being such that the configuration inputs can be coded in binary fashion, a coding and decoding device being provided for the coding.

11. The apparatus as recited in claim 1, wherein the apparatus is embodied so that exactly two signal states are settable.

12. A microcontroller, comprising:
    at least one respective energy source connected to each of configuration inputs, the at least one respective energy source able to assume at least two states to set at least two signal states at each configuration input; and
    a setting arrangement configured to control the states of each energy source in such a way that a predefined signal state exists for each configuration input;
    wherein the microcontroller is configured such that:
        one signal state is set at each of the configuration inputs in the context of a test mode; and
        a signal state differing from the one signal state is predefined, the differing signal state prevailing over the set signal state only when a fault exists in terms of the set signal state of the respective configuration input.

13. A method for allocating configuration inputs of a microcontroller, such that at each configuration input, one signal state of at least two possible signal states is to be set, the method comprising:
    providing one energy source for each configuration input, wherein all of the energy sources are set by a configuration word in such a way that one predefined signal state of the at least two signal states exists at each configuration input;
    setting one signal state at each of the configuration inputs in the context of a test mode; and
    predefining, using the configuration word, a signal state differing from the one signal state, the differing signal state prevailing over the set signal state only when a fault exists in terms of the set signal state of the respective configuration input.

14. The method as recited in claim 13, wherein each energy source contains one current source for each signal state to be set.

15. The method as recited in claim 13, wherein each energy source is formed from a pull-up current source and a pull-down current source, and includes a switch that switches over between the pull-up current source and the pull-down current source.

16. The method as recited in claim 13, wherein the setting of the energy sources is by an arrangement that includes a configuration register which contains one register cell for each configuration input.

17. The method as recited in claim 16, wherein each register cell is associated with one energy source and one configuration input.

18. The method as recited in claim 16, wherein at least one additional register cell is provided with which the other register cells can be at least one of blocked and enabled, the additional register cell being one of contained in the configuration register or associated with the configuration register.

19. The method as recited in claim 16, wherein a signal conditioning module is inserted between each configuration input and each register cell.

20. The method as recited in claim 13, wherein the setting of the energy sources is by a setting arrangement, a signal conditioner being between the setting arrangement and the configuration inputs.

* * * * *